United States Patent [19]
Kaiser et al.

[11] Patent Number: 5,936,842
[45] Date of Patent: *Aug. 10, 1999

[54] HOUSING FOR ELECTRIC-DRIVE UNITS

[75] Inventors: Norbert Kaiser, Stuttgart; Bernhard Siegwart, Asperg; Peter Grabandt, Remseck; Matthias Spaeth, Möglingen, all of Germany

[73] Assignee: Robert Bosch GmbH, Stuttgart, Germany

[ * ] Notice: This patent issued on a continued prosecution application filed under 37 CFR 1.53(d), and is subject to the twenty year patent term provisions of 35 U.S.C. 154(a)(2).

[21] Appl. No.: 08/491,904
[22] PCT Filed: Dec. 17, 1993
[86] PCT No.: PCT/DE93/01209
  § 371 Date: Jul. 14, 1995
  § 102(e) Date: Jul. 14, 1995
[87] PCT Pub. No.: WO94/16184
  PCT Pub. Date: Jul. 21, 1994

[51] Int. Cl.$^6$ .......................... H05K 07/12; H01R 13/00
[52] U.S. Cl. .................. 361/752; 361/748; 361/627; 361/736; 361/741; 361/679; 361/730; 361/759; 361/801; 361/740; 361/755; 174/50; 174/52.1; 160/188; 160/189; 160/193; 160/310; 49/28; 49/199; 49/139; 49/362
[58] Field of Search .................................. 361/752, 748, 361/627, 736, 741, 679, 730, 759, 801, 740; 174/50, 52.1; 160/188, 189, 193, 310; 49/28, 199, 139, 362

[56] References Cited

U.S. PATENT DOCUMENTS

| | | | |
|---|---|---|---|
| 3,608,612 | 9/1971 | Pemberton et al. | 160/188 |
| 4,652,969 | 3/1987 | Stegenga | 361/694 |
| 4,653,565 | 3/1987 | Iha et al. | 160/193 |
| 5,010,688 | 4/1991 | Dombrowski et al. | 49/362 |
| 5,282,337 | 2/1994 | Dunham et al. | 49/199 |

FOREIGN PATENT DOCUMENTS

| | | |
|---|---|---|
| 3012465 | 10/1981 | Germany . |
| 3726685 | 2/1989 | Germany . |
| 3203577 | 8/1993 | Germany . |

*Primary Examiner*—Leo P. Picard
*Assistant Examiner*—David Foster
*Attorney, Agent, or Firm*—Venable; George H. Spencer; Norman N. Kunitz

[57] ABSTRACT

The invention takes as its departure point a housing (10) for receiving electric drives (16, 18, 20), in particular garage-door drives, and/or the controls (24, 26) thereof, which housing exhibits at least two housing parts (12, 14). Provision is made on the housing parts for a latching device (34, 52, 68, 110) and guide elements (108, 112) for the reliable connection of the housing parts (12, 14) and for latching-in and retaining functional components (22, 28, 78) and/or circuit boards (24, 26) for the controls. Consequently, a structure with few individual parts and simple mounting and demounting is achieved.

8 Claims, 3 Drawing Sheets

HOUSING FOR ELECTRIC-DRIVE UNITS

PRIOR ART

The invention relates to a housing for receiving electric drives, in particular garage-door drives, and the control means therefore. A housing of this type, as is known, for example, from DE-PS 30 12 465 or DE-PS 37 26 685, on the one hand receives subassemblies, such as electric motor and gear mechanism, power supply unit, circuit boards or lighting devices, and, on the other hand, constitutes a link between the force-transmitting elements and the static peripherals, for example, a garage ceiling or a garage door. Such a housing thus has to be of a solid design and have enough space and fastening means for the individual subassemblies.

It is known, from DE-OS 32 03 577, to fasten the drive on a support and to cover it by a protective cover which is screwed onto the support.

Since systems with housings of the type mentioned in the introduction are commercially available and can thus be acquired and mounted by anyone, the intention is to provide a housing which permits the simple and reliable mounting of the entire system, receives individual subassemblies in a space-saving manner, can be assembled without special tools and, of course, complies with the safety regulations which are in force.

SUMMARY AND ADVANTAGES OF THE INVENTION

According to the invention there is provided a housing for receiving an electric garage-door drive and the control means thereof, which housing exhibits at least two housing parts, wherein the housing parts exhibit latching means and guide elements for the reliable connection of the housing parts and for latching-in and retaining at least one functional component and at least one circuit board for the control means. The housing according to the invention with the defining features as mentioned above facilitates assembly in that the housing itself and the functional components to be received by the housing, such as power supply unit, lighting device and the like, can be plugged in in a simple manner and are then arrested by self-closing latching means. These may, if required, be demounted again just as simply.

By virtue of the shape and size of the latching means, which have to be adapted to the geometry of the corresponding functional components, defective insertion of the functional components into the housing is avoided effectively. Furthermore, the number of the additional fastening means, for example screws, rivets, clamps and the like, which have to be handled individually and can go missing can be reduced considerably.

By way of the further disclosed features, further, advantageous refinements of the housing according to the invention disclosed above are possible. Particularly simple mounting and demounting is possible if the latching means engage one in the other within the housing and at least one housing part exhibits openings in the region of the latching means, through which openings said latching means can be unlocked by means of a tool. A special tool is not required for this purpose; all that is needed is a tool with a narrow shank.

If resilient elements are integrally formed on the housing part which receives the functional components, which resilient elements press the functional components, in the installed state, against the latching elements, a secure interconnecting arrangement is ensured. Moreover, size tolerances may be compensated. Upon installation of a transformer, the laminated stack can be clamped in between the latching means and the resilient elements, and noise caused by vibration is avoided in this manner.

It is particularly advantageous if a housing part exhibits a translucent cover which is connected rotatably or pivotably to, and can be latched in, the housing part and by way of which the lighting means of a lighting device can be exchanged. Said cover may be part of the housing part and be connected in a movable and captive manner to said housing part via a defined bending point, a so-called film hinge. This means that the entire housing part does not have to be demounted if the lighting device fails.

As further functional components, a housing part can receive limit switches in the form of wire loops which can then be latched into the housing part and can be connected directly to a circuit board arranged in the housing part. Here too, the outlay for mounting and demounting and the number of individual parts can be reduced considerably by the latchable connection. Furthermore, the wire loops of the limit switch, upon closure of the contact, carry out a rubbing movement and clean themselves in this manner, as a result of which a reliable contact is ensured.

If the housing exhibits clearances for connections which are led to the outside and can also be reached when the housing is closed, further functional components can be received in the housing and operated outside the housing in an electrically safe manner. It is, for example, possible here, in the case of a garage-door drive, to arrange a battery-charging unit in the housing and, if required, to connect it to the car battery via the connection which is led to the outside.

BRIEF DESCRIPTION OF THE DRAWINGS

An exemplary embodiment of a housing for a garage-door drive is shown in the drawing and is explained in more detail in the following description along with further advantages.

FIGS. 3 to 7 are each depicted with the corresponding functional components.

DESCRIPTION OF THE EXEMPLARY EMBODIMENTS

Figure 1:
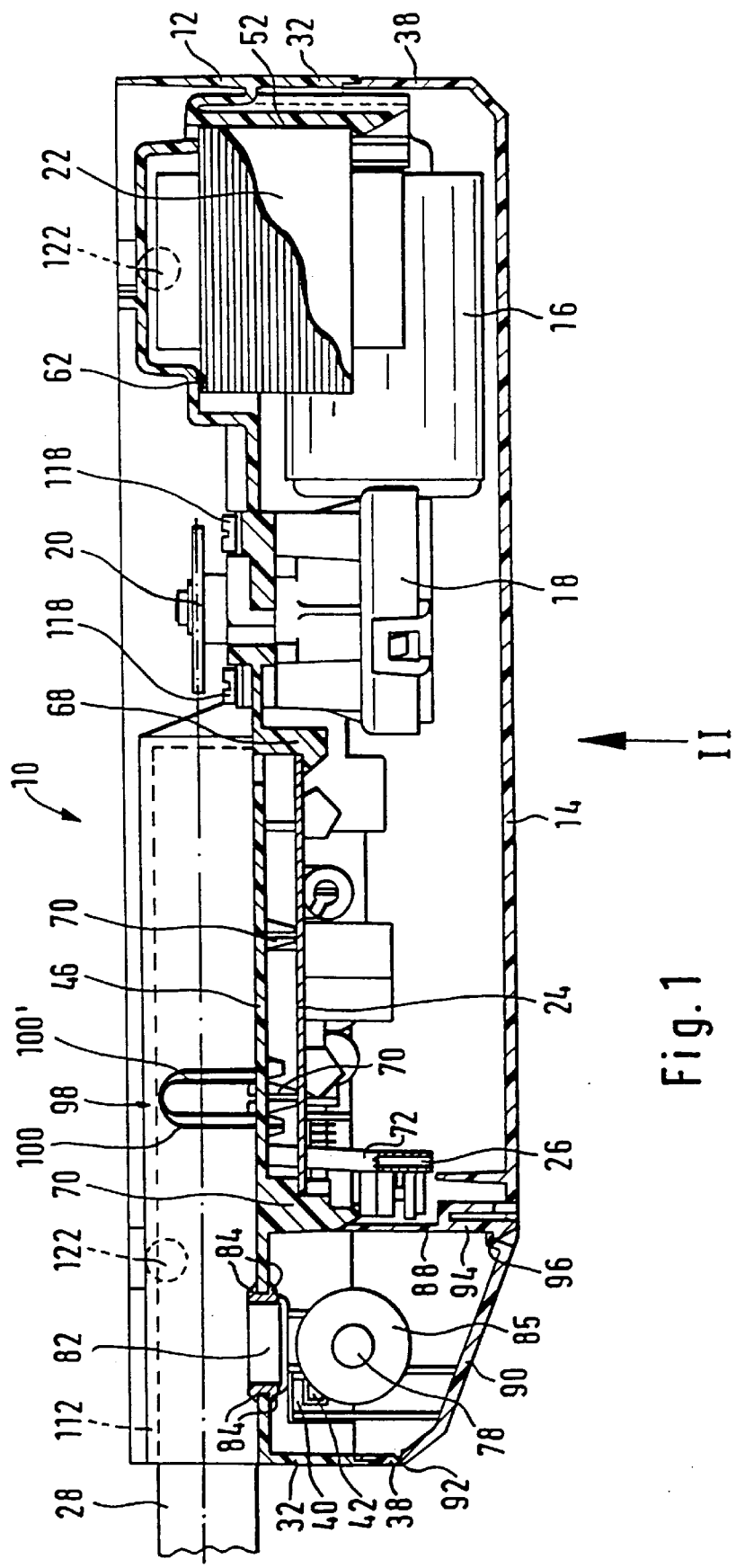
FIG. 1 shows a side view of a housing with inserted functional components, in section along line I—I in FIG. 2.
Figure 2:
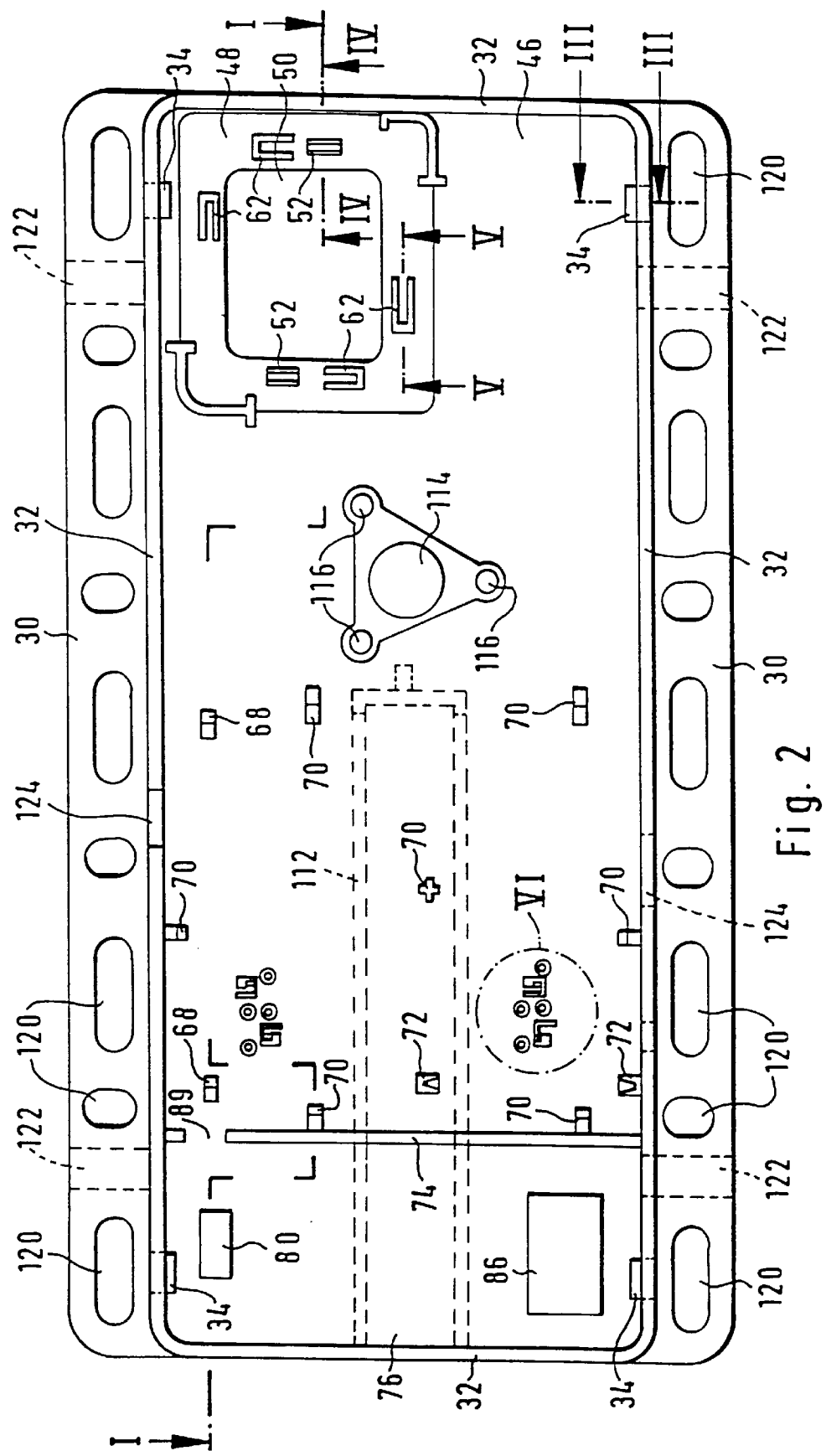
FIG. 2 shows a view of a housing part in accordance with the arrow II in FIG. 1 without inserted functional components.
Figure 3:
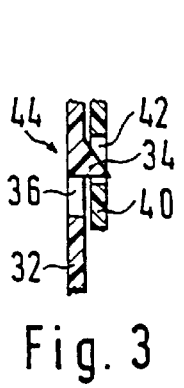
FIG. 3 shows a section along line III—III in FIG. 2.

The housing 10 represented in FIG. 1 exhibits a first housing part 12 and a second housing part 14 and receives an electric motor 16 together with a gear mechanism 18 and chain pinion 20 and a transformer 22, circuit boards 24 and 26 and a retaining rail 28 of a garage-door drive. The first housing part 12, which is represented in FIG. 2 without any subassembly and without the second housing part 14, has a base 30 and a somewhat narrower, box-shaped structure with walls 32 which is perpendicular to said base 30. At four spaced-apart locations, the walls 32 have inwardly projecting elevations 34 in the form of lugs and, directly therebeneath, openings 36, as is represented in FIG. 3.

The second housing part 14 exhibits walls 38 with four continuations 40 which are in the form of tabs and each have an opening 42. In the assembled position, the tab-like continuations 40 correspond with the lug-like elevations 34, the elevations 34 latching into the openings 42 of the continuations 40 when the housing 10 is closed.

In order to demount the housing parts 12 and 14, each continuation 40 has to be bent inwards, using a narrow tool, from the outside 44 through the respective opening 36 and raised above the elevations 34. In this manner, the housing may indeed be opened easily, but not without using a tool, the only condition being that the tool itself has to have a narrow shank.

Figure 4:
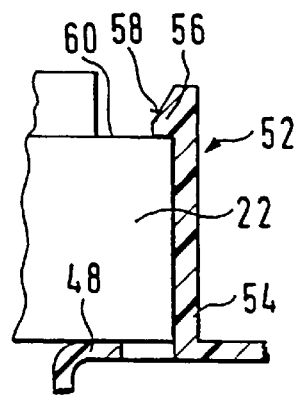
FIG. 4 shows a section along line IV—IV in FIG. 2.
Figure 5:
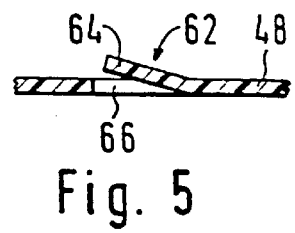
FIG. 5 shows a section along line V—V in FIG. 2.
Figure 6:
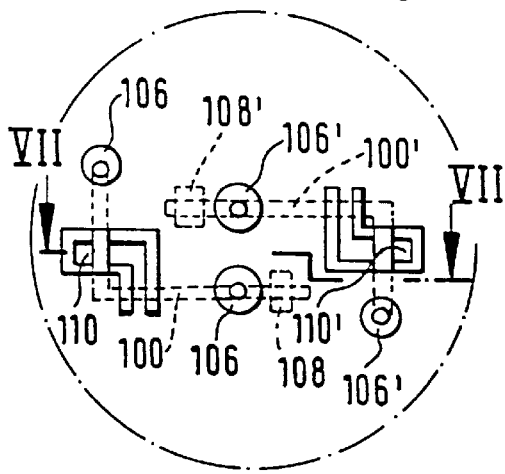
FIG. 6 shows an enlargement of the detail VI in FIG. 2.

The first housing part 12 exhibits a floor 46 into which there is moulded a depression 48, 50 (from the view of FIG. 2) which is in the form of a step and receives the transformer 22. Starting from the step 48 of the depression, latching means 52 extend vertically upwards (FIG. 4), which latching means 52 exhibit a shank 54 and a lug 56. Integrally formed on the lugs 56 is a bevel 58 which effects the situation where, when the transformer 22 is inserted, the shank 54 is bent outwards slightly, the transformer 22 can be moved downwards and the lug 56 can then come into abutment against, and/or latch in, a shoulder 60. The exemplary embodiment shows two latching means 52 which are located diametrically opposite one another with respect to the depression 48, 50; however, a plurality of such latching means 52 may also be provided if required.

The step 48 of the depression furthermore contains resilient elements 62 which each have a tab 64, oriented in the direction of the latching means 52, in an opening 66. When the transformer 22 is in the installed state, the tab 64, corresponding to the size of the transformer 22, is pressed into the opening 66 and/or, for its part, presses the transformer 22 against the lugs 56 of the latching means 52. This thus achieves a firm clamped-in interconnecting arrangement by means of which production tolerances of the transformer can be compensated and noise caused by vibration can be avoided.

The first housing part 12 further has latching means 68 and spacers 70 for receiving the circuit board 24. Analogously to the latching means 52, the latching means 68 exhibit a shank, a lug and a bevel.

The circuit board 26, which is arranged perpendicularly with respect to the circuit board 24 and is connected thereto via plug-in contacts, is retained by guide means 72.

A wall 74 extending from the floor 46 divides off a chamber 76 which receives a lighting device 78. For this purpose, the floor 46 exhibits, in the outer region of the chamber 76, an opening 80 into which a base 82 with lugs 84 of the lighting device 78 is fitted such that a firm interconnected arrangement is produced.

Provided on that side of the chamber 76 located opposite the opening 80 is a further opening 86, which is located in the region of the inserted lighting means 85 and by means of which a heat exchange can take place.

The second housing part 14 has a wall 88 which corresponds with the wall 74, with the result that, in the assembled state, the chamber 76 is closed all around apart from the opening 86 and a through-passage 89 in the wall 74 for the electric supply line for the lighting device 78. In the region of the lighting device 78, the second housing part 14 is beveled and provided with a cover 90.

In the region of the wall 38, the cover 90 is integrally formed on the second housing part 14, the transition region exhibiting a defined bending point 92, a so-called film hinge, as a result of which the cover is retained in a movable manner. On that side of the cover 90 located opposite the bending point 92, a latching means 94 is integrally formed in the wall 88, which latching means comprises a shank, lug and bevel corresponding to the latching means 52. The cover 90 can interact with said latching means, by virtue of its integrally formed abutment shoulder 96, and be retained thereby.

Figure 7:
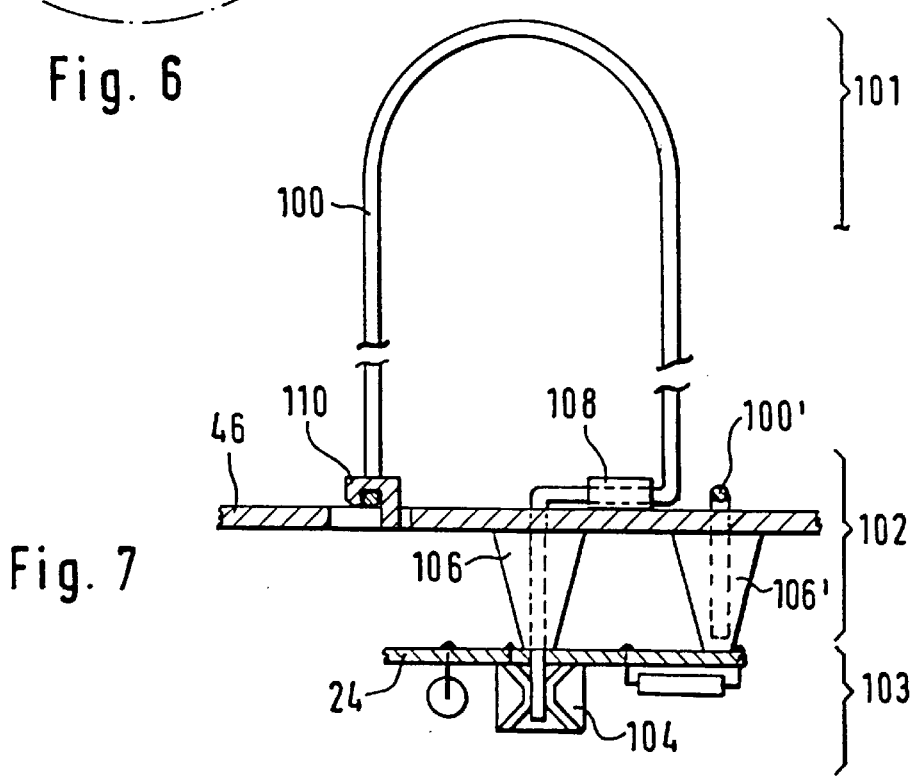
FIG. 7 shows a section along line VII—VII in FIG. 6.

Arranged on that side of the floor 46 located opposite the circuit board 24 are limit switches 98 made of wire 100 in loop form (FIG. 7), which exhibit a contact region 101, a retaining region 102 and a connection region 103.

In the connection region 103, a wire end is introduced through the circuit board 24 into a connection element 104. For this purpose, the circuit board 24 bears on spacers 106 and 106', which simultaneously form part of the retaining region 102.

The spacers 106 have wire 100 fitted through them and are integrally formed on the floor 46. The wire 100 also fits through the floor 46 and is then bent in order to come to rest in a guide element 108. Behind the guide element 108, the wire is bent once again and extends away from the floor 46 into the contact region 101, from where it is guided back in loop form to the floor 46.

There, the wire is bent again and runs parallel to the floor 46 which, in this region, exhibits hook-shaped latching means 110 which fit around the wire 100 and retain the same. Behind the latching means 110, the wire 100 is bent once again and guided through the floor 46 and a spacer 106 without play and retained.

A second wire 100' is shaped analogously and retained by a spacer 106', a guide element 108' and a latching means 110' and arranged in a manner laterally offset with respect to the first wire 100.

If the wires 100 and 100' are pressed one upon the other, for example by a switching cam (not shown), then they make contact with one another in the loop-like contact region 101, as a result of which, due to the bent wire form there, the two wires 100 and 100' will rub against one another upon contact and will always clean the contact surfaces in this manner. This advantageous arrangement thus permits reliable contact, even if dirt has to be taken into consideration.

The pre-bent wires 100 are mounted in that the wires 100 are introduced into the spacers 106 and the guide elements 108 and are then fastened by a slight bending-out operation and lateral insertion into the latching means 110. The limit switches 98 retained in this manner can be demounted again in a simple manner without using any tools by raising the latching means 110 slightly and carrying out the above steps in reverse order. A plurality of such limit switches 98 may be provided.

On the side of the limit switches 98, a guide duct 112 is integrally formed, on the floor 46, parallel to the longitudinal extent of the housing part 12. Said guide duct 112 is open on that side of the first housing part 12 located opposite the step-like depression 48, 50, extends approximately as far as the centre of said housing part 12, and receives the retaining rail 28 in a play-free manner corresponding to FIG. 1.

In extension of the guide duct 112, the floor 46 exhibits a circular opening 114 and three symmetrically distributed openings 116. The drive, starting from the gear mechanism 18 for the chain pinion 20, is fitted through the opening 114 and fastened by means of screws 118 through the openings 116. This arrangement and/or fastening could also take place by latching means, but it has to be ensured that the forces which occur and the torques transmitted by the motor 16 to the chain (not shown) via the chain pinion 20 do not release this fastening, even in the event of alternating loading.

The structure according to the exemplary embodiment along with the guide duct 112 and the screwed drive elements ensure a high degree of stability and transmission safety as regards the forces and torques which occur.

A plurality of slots 120 are provided longitudinally and transversely on the base 30 such that simple mounting of the housing part on a wall, ceiling or the like is possible. Furthermore, further holes 122 pass through the base transversely with respect to the slots 120. Preferably angular rails or the like can be fastened on said holes 122, as a result of which mounting can be adapted to local conditions.

The walls 32 exhibit clearances 124, preferably in the region of the circuit board 24, through which connections can be led to the outside even if the housing 10 is closed. Such connections may constitute, for example, the point of contact with a further lighting device or with a battery-charging unit integrated in the housing. Furthermore, the openings may permit access to fuses and rotary potentiometers or the like for adjusting electric circuit variables.

Further latching means may be provided in the housing, which latching means receive and secure, for example, cables introduced through further openings.

The housing is preferably produced from a thermoplastic as an injection-molded article.

We claim:

1. A housing for receiving an electric garage-door drive and the control means thereof, which housing has at least two housing parts, and wherein the housing parts have latching means, comprising latching elements integral with the housing parts, and guide elements for the reliable connection of the housing parts and for latching-in and retaining at least one functional component and at least one circuit board for the control means.

2. The housing as claimed in claim 1, wherein the latching means for the housing parts engage one in the other within the housing and at least one housing part exhibits openings in the region of the latching means for the housing parts, through which openings said latching means for the housing parts can be unlocked by use of a tool.

3. The housing as claimed in claim 1, wherein the latching means for the at least one of the functional components further includes resilient elements which are integrally formed on the housing part which receives the functional components, which resilient elements press the functional components, in the installed state, against the latching elements of the respective latching means.

4. The housing as claimed in claim 1, wherein at least one housing part exhibits slots for the direct fastening of the housing on a wall, ceiling or the like and, transversely with respect to the slots, exhibits further holes for indirect fastening, in particular by means of spacer rails.

5. The housing as claimed in claim 1, having a lighting device arranged within the housing, and wherein one housing part has a translucent cover which is connected rotatably or pivotably to, and can be latched in, the one housing part and by way of which the lighting element of the lighting device can be exchanged.

6. The housing as claimed in claim 1, wherein at least one housing part has at least one limit switch in the form of a pair of wire loops which are latched to the at least one housing part by a latching element and are directly connected in electrical terms to the circuit board arranged in the housing part.

7. The housing as claimed in claim 6, wherein the wire loops of the limit switch, upon closure of the contact, carry out a rubbing movement.

8. The housing as claimed in claim 1, wherein clearances, through which connections which can be used when the housing is closed can be led to the outside, are provided in at least one of the housing parts.

* * * * *